United States Patent
Kim et al.

(10) Patent No.: US 7,791,160 B2
(45) Date of Patent: Sep. 7, 2010

(54) HIGH-PERFORMANCE FET DEVICE LAYOUT

(75) Inventors: Jonghae Kim, Fishkill, NY (US);
Sungjae Lee, Burlington, VT (US);
Jean-Olivier Plouchart, New York, NY (US); Scott Keith Springer, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 11/923,919

(22) Filed: Oct. 25, 2007

(65) Prior Publication Data

US 2009/0108349 A1    Apr. 30, 2009

Related U.S. Application Data

(63) Continuation-in-part of application No. 11/550,818, filed on Oct. 19, 2006, now Pat. No. 7,689,946.

(51) Int. Cl.
*H01L 29/786* (2006.01)
(52) U.S. Cl. .................................................. 257/499
(58) Field of Classification Search .................. 257/499
See application file for complete search history.

(56) References Cited

U.S. PATENT DOCUMENTS

| 4,075,651 A | 2/1978 | James |
| 4,297,718 A | 10/1981 | Nishizawa et al. |
| 5,283,452 A | 2/1994 | Shih et al. |
| 6,838,708 B2 | 1/2005 | Lin et al. |
| 2003/0006847 A1 | 1/2003 | Nelson |
| 2003/0085428 A1 | 5/2003 | Nelson et al. |
| 2004/0113201 A1 | 6/2004 | Bhalla et al. |
| 2005/0184339 A1 | 8/2005 | Allen et al. |

FOREIGN PATENT DOCUMENTS

JP          9106994        4/1997

OTHER PUBLICATIONS

Office Action (Mail Date Jul. 7, 2009) for U.S. Appl. No. 11/550,818, filed Oct. 19, 2006.
Notice of Allowance (Mail Date Nov. 13, 2009) for U.S. Appl. No. 11/550,818, filed Oct. 19, 2006.

*Primary Examiner*—Kiesha R Bryant
*Assistant Examiner*—Tucker Wright
(74) *Attorney, Agent, or Firm*—Schmeiser, Olsen & Watts; Richard M. Kotulak

(57) ABSTRACT

A fast FET, a method and system for designing the fast FET and a design structure of the fast FET. The method includes: selecting a reference design for a field effect transistor, the field effect transistor including a source, a drain, a channel between the source and drain, a gate electrode over the channel, at least one source contact to the source and at least one contact to the drain, the at least one source contact spaced a first distance from the gate electrode and the at least one drain contact spaced a second distance from the gate electrode; and adjusting the first distance and the second distance to maximize a performance parameter of the field effect transistor to create a fast design for the field effect transistor.

1 Claim, 11 Drawing Sheets

HIGH-PERFORMANCE FET DEVICE LAYOUT

This Application is related to U.S. patent application Ser. No. 11/550,818, filed Oct. 19, 2006.

FIELD OF THE INVENTION

The present invention relates to the field of field effect transistors (FET); more specifically, it relates to an FET having a gate to source/drain spacing optimized for improved FET performance, a method and system for determining the gate to source/drain spacing for optimizing the performance of the FET, and a design structure for an FET having a gate to source/drain spacing optimized for improved FET performance.

BACKGROUND OF THE INVENTION

A most important issue for the semiconductor industry is integrated circuit performance scalability. Scalability is the tracking of performance with decreased transistor size. In general, scalability is adversely affected by the non-scalability of complementary metal-oxide-silicon (CMOS) device technology groundrules below about 250 nm and the non-scalability of process tolerances. Without some technique to overcome CMOS scalability, the trend of decreasing technology groundrules to increase performance cannot be sustained. Therefore, there is a need for a methodology to overcome the scalability issues of CMOS technology.

SUMMARY OF THE INVENTION

A first aspect of the present invention is a method, comprising: selecting a reference design for a field effect transistor, the field effect transistor including a source, a drain, a channel between the source and drain, a gate electrode over the channel, one or more source contacts to the source and one or more drain contacts to the drain, each of the one or more source contacts spaced a first distance from the gate electrode and each of the one or more drain contacts spaced a second distance from the gate electrode; and adjusting the first distance and the second distance to maximize a performance parameter of the field effect transistor to create a fast design for the field effect transistor.

A second aspect of the present invention is the first aspect, wherein the performance parameter is a power cut-off frequency of the field effect transistor.

A third aspect of the present invention is the first aspect further including: limiting an amount of the adjusting the first and second distances to prevent a current cut-off frequency of the field effect transistor from being less than a predetermined value.

A fourth aspect of the present invention is the first aspect of the present invention, wherein said performance parameter is a current cut-off frequency of said field effect transistor.

A fifth aspect of the present invention is the first aspect, wherein a distance between the source and drain defines a channel length, extending in a lengthwise direction, of the field effect transistor, the first and second distances extending along the lengthwise direction.

A sixth aspect of the present invention is the first aspect, wherein the adjusting the first and second distances comprises increasing only the first distance, increasing only the second distance or increasing both the first and second distances.

A seventh aspect of the present invention is the first aspect, further including: limiting an amount of the adjusting the first and second distances to prevent a total area of the field effect transistor from exceeding a pre-determined limit.

An eighth aspect of the present invention is the first aspect further including: simulating a first circuit capable of oscillation, the first circuit including at least one field effect transistor having the fast design; measuring a simulated first oscillation rate of the first circuit; comparing the first oscillation rate to a predetermined oscillation rate; and adjusting a device geometry, other than the first and second distances, of the reference design and repeating the adjusting the first distance and the second distance if the first oscillation rate is less than the predetermined oscillation rate.

A ninth aspect of the present invention is the first aspect, further including: simulating a first circuit capable of oscillation, the first circuit including at least one field effect transistor having the fast design; measuring a simulated first oscillation rate of the first circuit; simulating a second circuit capable of oscillation, the second circuit including at least one field effect transistor having the reference design; measuring a simulated second oscillation rate of the second circuit; comparing the first and second oscillation rates; and adjusting a device geometry, other than the first and second distances, of the reference design and repeating the adjusting the first distance and the second distance if the first oscillation rate is less than the second oscillation rate.

A tenth aspect of the present invention is the first aspect, further including: designing the field effect transistor.

An eleventh aspect of the present invention is the first aspect, wherein the source comprises multiple source regions, the drain comprises multiple drain regions, the channel comprises multiple channel regions between respective pairs of the source and drain regions, the gate electrode comprising a spine and multiple fingers extending from the spine, the fingers over respective channel regions, and at least one source contact of the one or more source contacts in each source region and at least one drain contact of the one or more drain contacts in each drain region.

A twelfth aspect of the present invention is the tenth aspect, wherein each of the at least one source contact of the one or more source contacts is equally spaced between adjacent fingers of the multiple fingers and wherein each of the at least one drain contact of the one or more drain contacts is equally spaced between adjacent fingers of the multiple fingers.

A thirteenth aspect of the present invention is the first aspect, wherein the reference design is for a field effect transistor to be fabricated on a silicon-on-insulator substrate.

A fourteenth aspect of the present invention is the first aspect, further including: generating a set of pairs of incremented first and second distances from the first and second distances; generating a set of power cut-off frequencies corresponding to the pairs of incremented first and second distances; and selecting a pair of incremented first and second distances corresponding to a maximum power cut-off frequency of the set of power cut-off frequencies, the adjusting the first distance and the second distance comprising substituting the pair of incremented first and second distances for the first and second distances.

A fifteenth aspect of the present invention is a design structure embodied in a machine readable medium used in a design process, the design structure comprising: a fast field effect transistor, comprising a source, a drain, a channel between the source and drain, a gate electrode over the channel, one or more source contacts to the source and one or more drain contacts to the drain, each of the one or more source contacts spaced a first distance from the gate electrode and each of the one or more drain contacts spaced a second distance from the gate electrode; and wherein the first and second distances, and a power cut-off frequency of the fast field effect transistor are greater than respective first and second distances and a power cut-off frequency of an otherwise identical reference field effect transistor.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
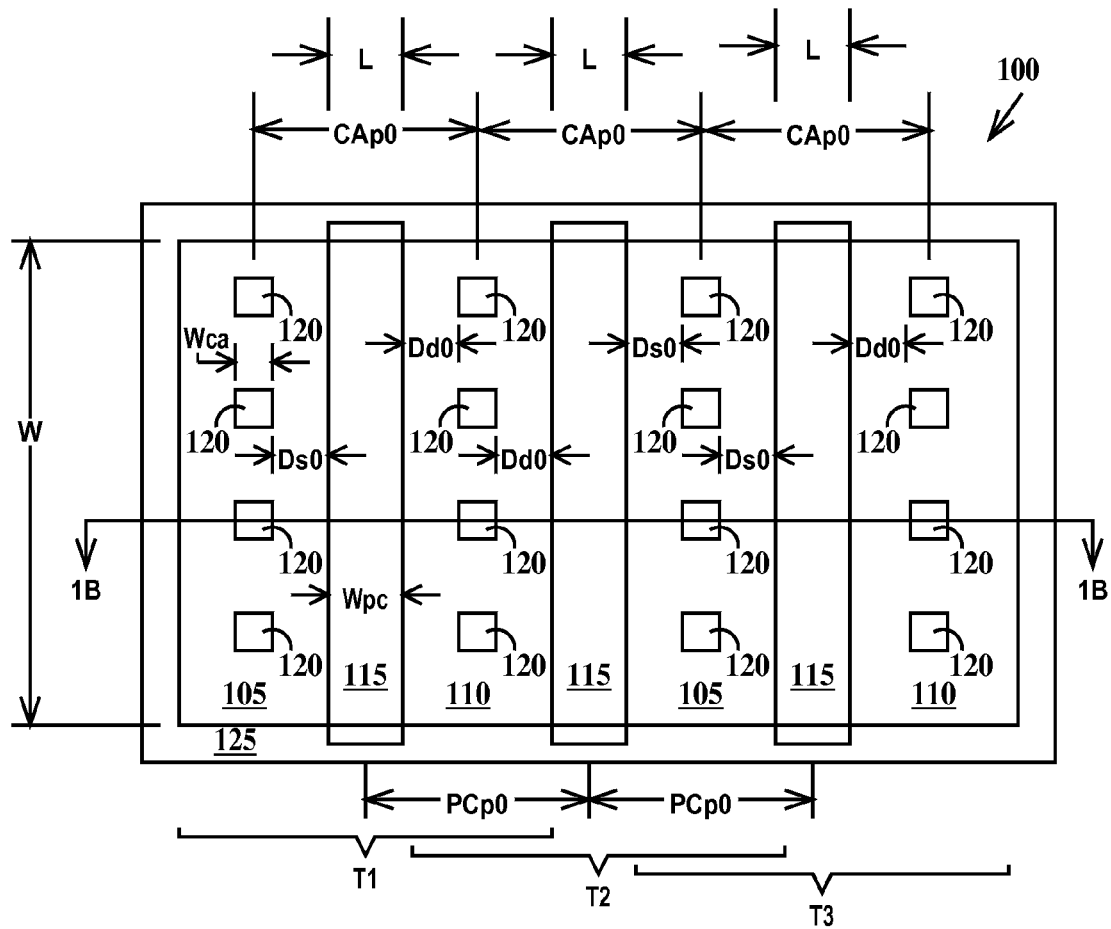
FIG. 1A is a top view and FIG. 1B is a cross-sectional view through line 1B-1B of FIG. 1A of an exemplary reference FET layout not optimized for performance according to embodiments of the present invention.
Figure 1B:
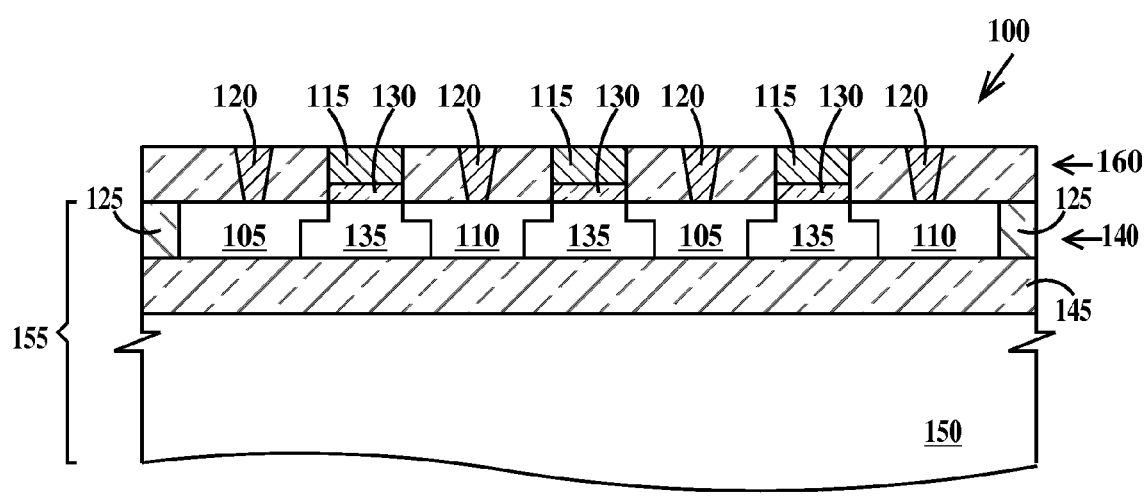

FIG. 1A is a top view and FIG. 1B is a cross-sectional view through line 1B-1B of FIG. 1A of an exemplary reference FET layout not optimized for performance according to embodiments of the present invention. In FIG. 1A, a device 100 includes sources 105 and drains 110 and gate electrodes 115 on opposite sides of the source/drains. Device 100 comprises three reference transistors T1, T2 and T3 with transistors T1 and T2 sharing a common drain and transistors T2 and T3 sharing a common source. Transistor T1, T2 and T3 may be N-channel field effect transistors (FETs) or NFETs or P-channel FETs or PFETs. Each of transistors T1, T2 and T3 have a channel width W in a widthwise direction and a channel length L in a lengthwise direction, the widthwise and lengthwise directions being perpendicular. The extent of L depends upon how far sources 105 and drains 110 extend under gate electrodes 115.

A set of source/drain contacts 120 are formed over sources 105 and drains 110. Device 100 is surrounded by a shallow trench isolation (STI) 125. Gate electrodes 115 are spaced apart in the lengthwise direction on a pitch PCp0 and contacts 120 are spaced apart in the lengthwise direction on a pitch CAp0. Contacts 120 to sources 105 are spaced in the lengthwise direction a distance Ds0 from gate electrodes 115 and contacts 120 to drains 110 are spaced in the lengthwise direction a distance Dd0 from gate electrodes 115. In one example Dd0 and Ds0 are equal. Gate electrodes 115 have a dimension Wpc in the lengthwise direction and contacts 120 have a dimension Wca in the lengthwise direction. If Wpc and Wca are held constant, then Ds0, Dd0 and (Ds0+Dd0) are a function of CAp0 and a function of PCp0.

In FIG. 1B, it can be further seen that gate electrodes 115 are formed on top of a gate dielectric 130 and that sources 105 and drains 110 are separated by a channel region 135 under gate electrodes 115. Sources 105, drains 110 and channels 135 are formed in a silicon layer 140 (along with STI 125), which is formed on top of a buried oxide layer (BOX) 145, which is formed on top of a silicon substrate 150. A silicon-on-insulator (SOI) substrate 155 is therefore comprised of silicon layer 140, BOX 145 and substrate 150. In one example, silicon layer 140 is single crystal-silicon. Gate electrodes 115 and contacts 120 are embedded in a dielectric layer 160 formed on top of silicon layer 140. In one example, gate electrodes 115 comprise doped or undoped polysilicon and contacts 120 comprise tungsten or other metals.

Returning to FIG. 1A, current FET design practice minimizes CAp0 and PCp0 and thus Ds0 and Dd0 in an effort to decrease the size and increase the performance of transistors T1, T2 and T3. By performance we mean the two operating frequencies described infra. However, minimizing CAp0 and PCp0 does not necessarily increase the operating frequencies, nor increase the operating frequencies as much as the methods of the present invention, because of gate to source/drain capacitance as described infra. Furthermore, the current design practice of minimizing CAp0 and PCp0 and thus Ds0 and Dd0 may actually reduce the maximum operating frequencies of the transistors.

Figure 2:
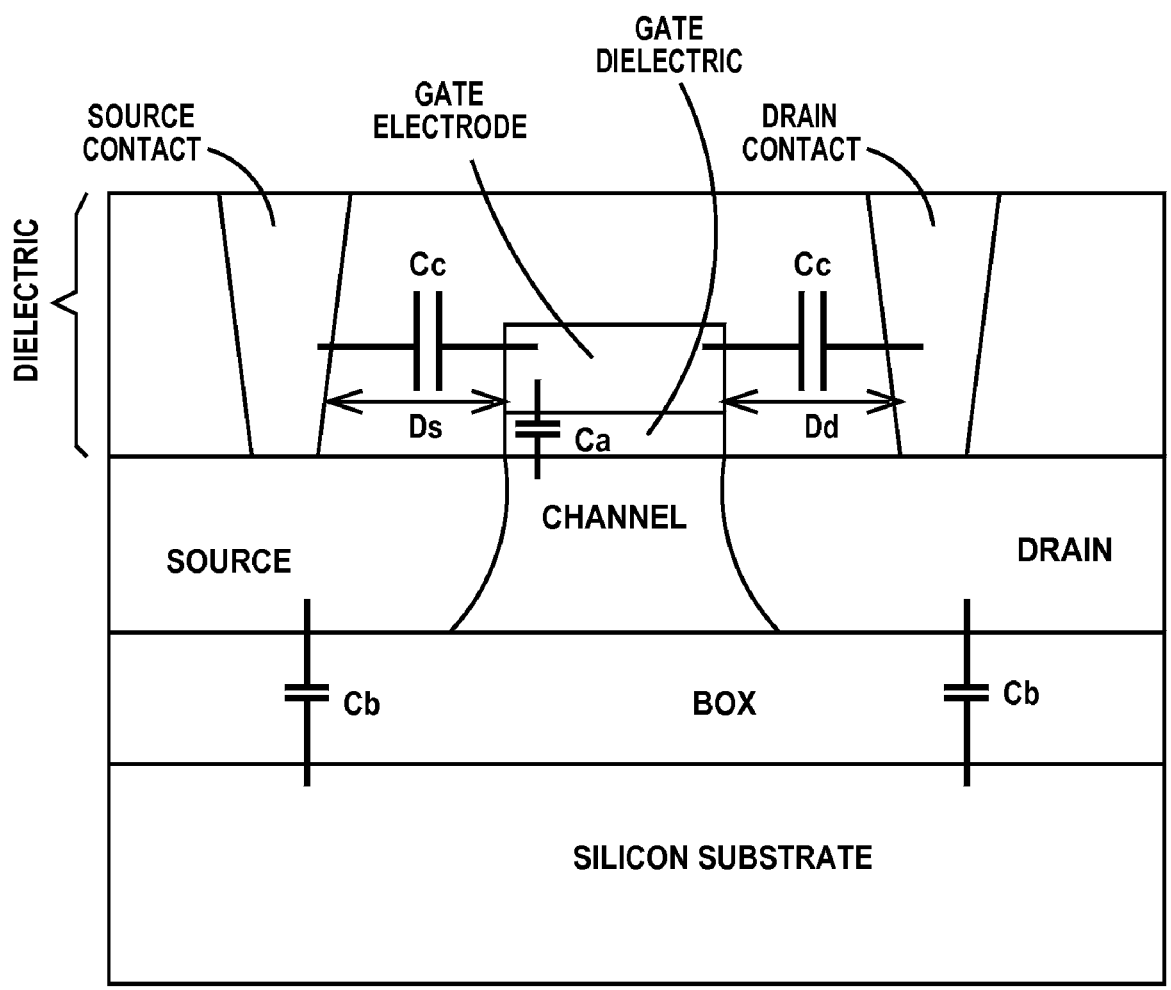
FIG. 2 is a schematic cross-sectional diagram of an exemplary FET illustrating the parasitic capacitances.

FIG. 2 is a schematic cross-sectional diagram of an exemplary FET illustrating the parasitic capacitances. In FIG. 2, three capacitances exist, the intrinsic gate capacitance Ca and the parasitic capacitances Cb and Cc. Ca is the capacitance between the gate electrode and the channel region of the FET. There may also be components (gate overlap capacitances) of Ca between the gate electrode and the source and drain when the gate overlaps the source/drains. Cb is the capacitance between the source and the silicon substrate and the drain and silicon substrate. Cc is the capacitance between the gate and the contacts to the source and to the drain and is a function of the source contact to gate electrode spacing Ds and the drain contact to gate electrode spacing Dd.

Because of the thickness of the BOX, Cb is so small as to have no significant effect on operating frequency and Ca is a constant for a given gate dielectric thickness, gate geometry and gate dielectric material. The embodiments of the present invention are directed to fast FETs having reduced values of Cc by increasing the values of Ds and Dd in the fast FETs (see FIG. 3 and description infra) compared to a reference FET such as described in FIGS. 1A and 1B and described supra.

Figure 3:
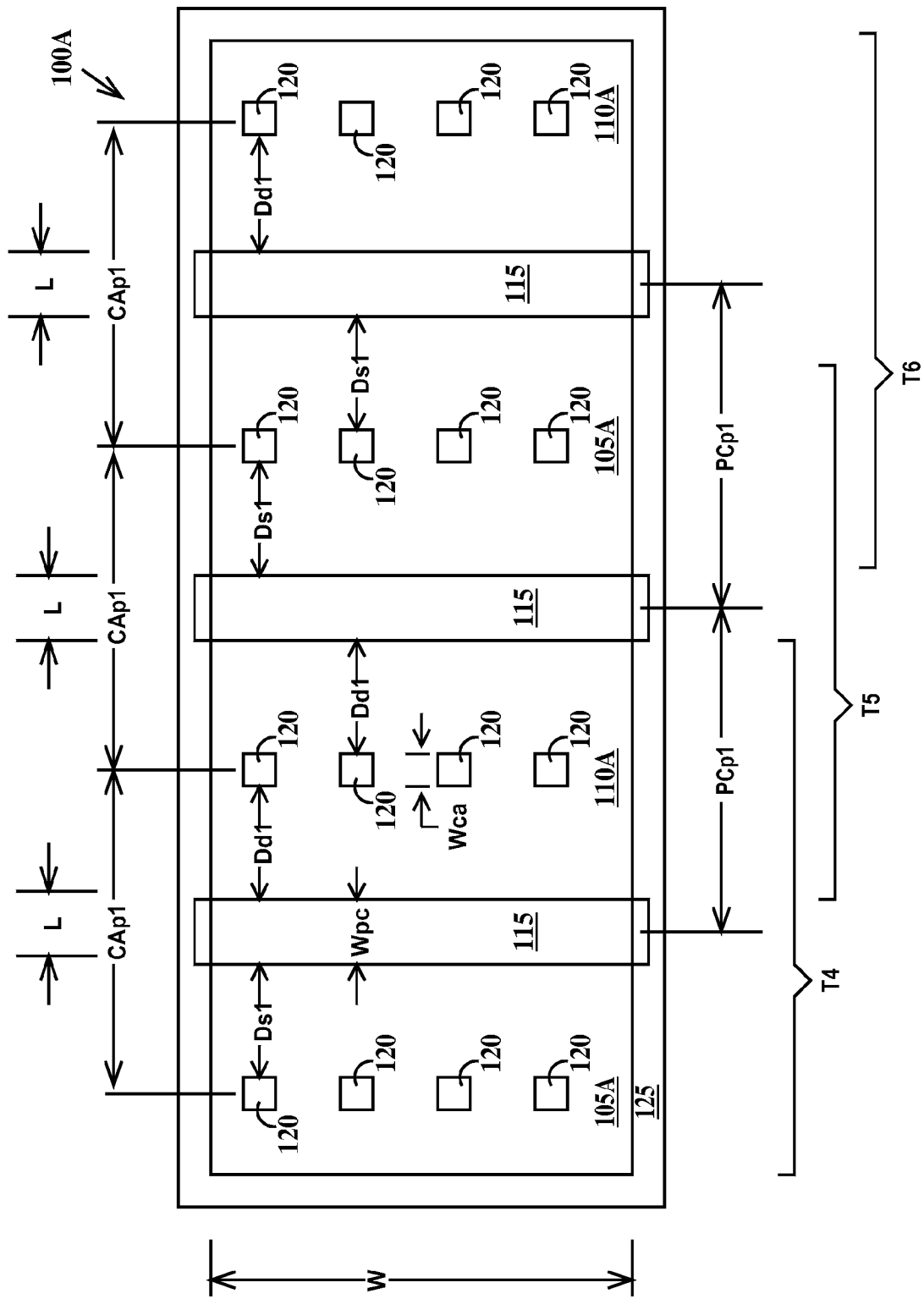
FIG. 3 is a top view of an exemplary fast FET layout having a gate to source/drain contact spacings optimized for performance according to embodiments of the present invention.

FIG. 3 is a top view of an exemplary fast FET layout having a gate to source/drain contact spacings optimized for performance according to embodiments of the present invention described infra. In FIG. 3, a fast device 100A is similar to the reference device 100 of FIG. 1A except the contact pitch CAp1 is greater than CAp0 of FIG. 1A, the gate electrode pitch PCp1 is greater than PCp0 of FIG. 1A, the source contact to gate electrode spacing Ds1 is greater than Ds0 of FIG. 1A and the drain contact to gate electrode spacing Dd1 is greater than Dd0 of FIG. 1A. Also transistors T1, T2 and T3 of FIG. 1A are replaced by fast transistors T4, T5 and T6 respectively. The only difference between transistors T1/T2/T3 and transistors T4/T5/T6 are the contact to gate spacings (Dsx and Ddx, where x=0 or 1); all other transistor physical parameters (i.e. doping levels, materials, thicknesses, etc) are the same.

Figure 4:
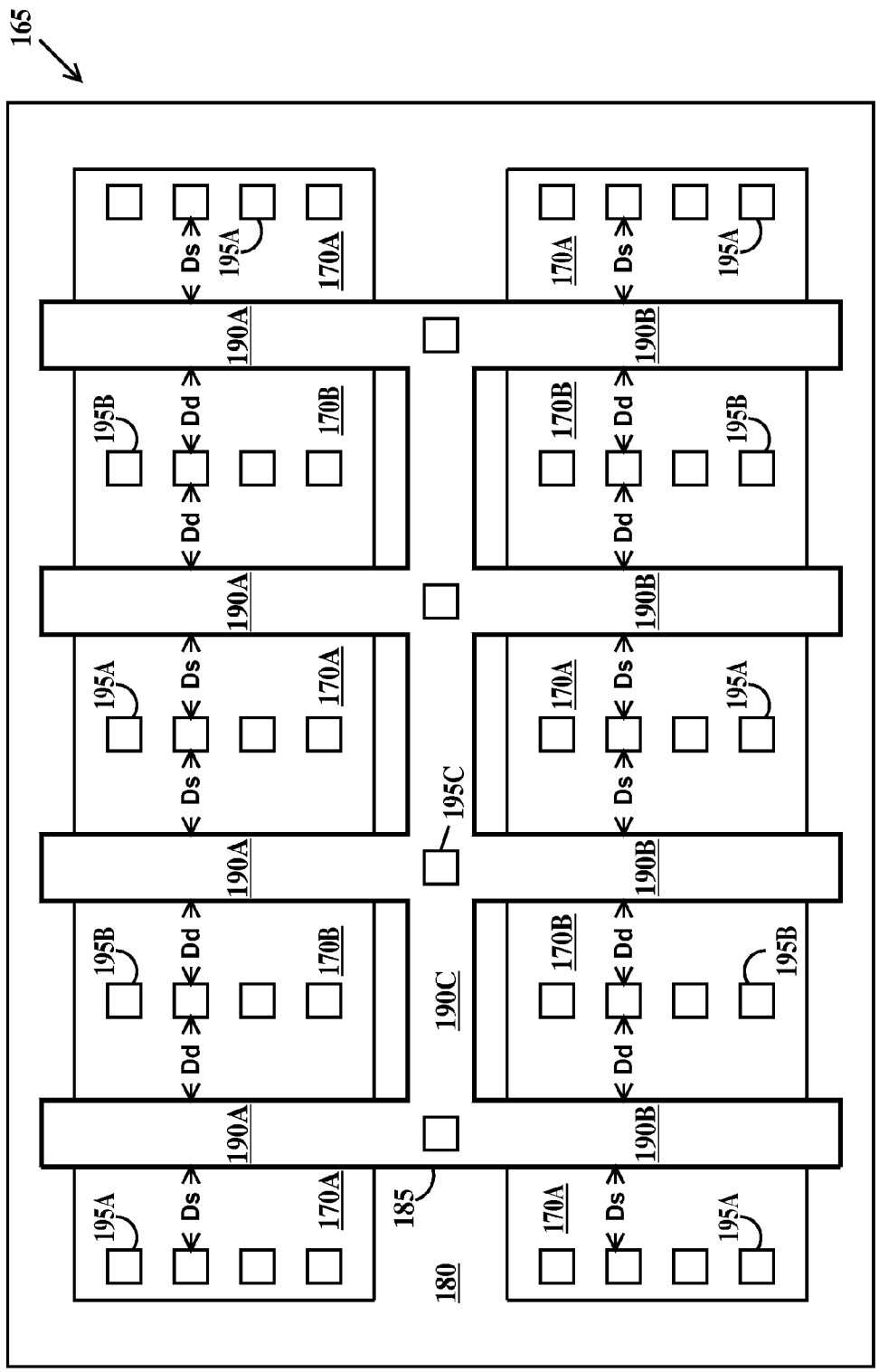
FIG. 4 is a schematic top view of an exemplary fast multi-finger FET having a gate to source/drain contact spacings optimized for performance according to embodiments of the present invention.

The embodiments of the present invention are applicable to multi-finger FETs. FIG. 4 is a schematic top view of an exemplary fast multi-finger FET having a gate to source/drain contact spacings optimized for performance according to embodiments of the present invention described infra. In FIG. 4, an FET 165 includes multiple source regions 170A and multiple drain regions 170B. Source and drain regions 170A and 170B are surrounded by STI 180. FET 165 also includes a gate electrode 185. Gate 185 includes multiple fingers 190A and multiple fingers 190B integrally connected to a spine 190C. Spine 190C is over STI 180. A multiplicity of source contacts 195A are provided to sources 170A and a multiplicity of drain contacts 195B are provided to drains 170B. There are also contacts 195C to gate electrode 185.

Source contacts 195A are spaced a distance Ds from fingers 190A and drain contacts 195B are spaced a distance Dd from fingers 190B. Distances Ds and Dd are selected for increased performance of fast FET 165 according to embodiments of the present invention described infra.

Therefore, based on FIGS. 1A, 1B, 3 and 4 and the descriptions thereof supra, a fast FET is defined as an FET having a source/drain contact to gate electrode spacing greater than the source/drain contact to gate electrode spacing of a reference FET, holding all other physical design parameters of the fast FET (except overall size of the fast FET) to values of the reference FET.

The performance of an FET may be measured by the two operating frequencies, (1) the current cut-off frequency (Ft) and (2) the power cut-off frequency (Fmax). Fmax is defined herein and in the claims as the maximum frequency of an FET beyond which power gain of the FET drops below unity. At frequencies higher than Fmax, an oscillator utilizing that FET will no longer oscillate. Ft is defined herein and in the claims as the maximum frequency of an FET beyond which the current gain of the FET drops below unity. The Fmax and Ft of fast FETs T4/T5/T6 of FIG. 3 can be determined from known parameters of reference FETs T1/T2/T3 of FIG. 1A and T4/T5/T6 as defined by the equations (1) through (5). Equations (1) through (5) are used in the algorithm illustrated in FIGS. 4 and 5 and described infra. Term C1 of equations (1), (2) and (4) is the summation of the capacitors Ca and Cc of FIG. 2 for a fast FET.

$$Fmax \approx \sqrt{\frac{Ft}{2\pi Rg(C1)}} \quad (1)$$

where:
Ft is defined by equation (2)
Rg is defined by equation (5); and
C1 is defined by equation (4).

$$Ft = \frac{gm1}{2\pi C1} \quad (2)$$

where:

gm1 is defined by equation (3); and
C1 is defined by equation (4).

$$gm1 = gm0 + \Delta gm[1 - e^{(D0-D1)}] \quad (3)$$

where:
D0 is the contact to gate electrode spacing of a reference FET having a known source contact to gate electrode spacing Ds0 and a known drain contact to gate electrode spacing Dd0 and where Ds0=Dd0=D0;
D1 is the contact to gate electrode spacing of a fast FET having a known source contact to gate electrode spacing Ds1 and a known drain contact to gate electrode spacing Dd1 and where Ds1=Dd1=D1;
gm0 is the transconductance of the reference FET having the contact to gate electrode spacing Ds=Dd=D0 (gm can be measured using the formula gm=Iout/Vin); and
Δgm=gm1−gm and is the maximum difference in gm between the reference FET and the fast FET and is empirically determined.

$$C1 = Ca + \frac{C0}{(D1/D0)} \quad (4)$$

where:
Ca is the intrinsic gate capacitance;
C0 is the known capacitance between the source contact and the gate electrode (Cd) or between the drain contact and the gate electrode (Cs), with Cd=Cs; and
D0 and D1 are as defined for equation (3).

$$Rg = Rg0 + \Delta Rwire(D1-D0) \quad (5)$$

where:
Rg0 is the known gate electrode resistance of the reference FET;
ΔRwire is the resistance per length of an additional (e.g. metal) wire required to wire up the gate electrode to a circuit node; and
D0 and D1 are as defined for equation (3).

The term ΔRwire (D1-D0) of equation (5) takes into consideration, that since the fast FET is larger than the reference FET that it would replace in a circuit, that the wire from a node in that circuit to the gate electrode will be longer. The ΔRwire (D1-D0) of equation (5) may be replaced by other terms as circuit layouts warrant or may be left out entirely.

It should be understood, that equations (1) trough (5) are specific to the case where Dd0=Ds0 and Dd1 Ds1 (the fast FET and the reference FET are symmetrical). When Dd0≠Ds0 and Dd1≠Ds1, equations similar to equations (1) though (5) may be developed and used in the algorithm illustrated in FIGS. 5 and 6 and described infra.

Figure 5:
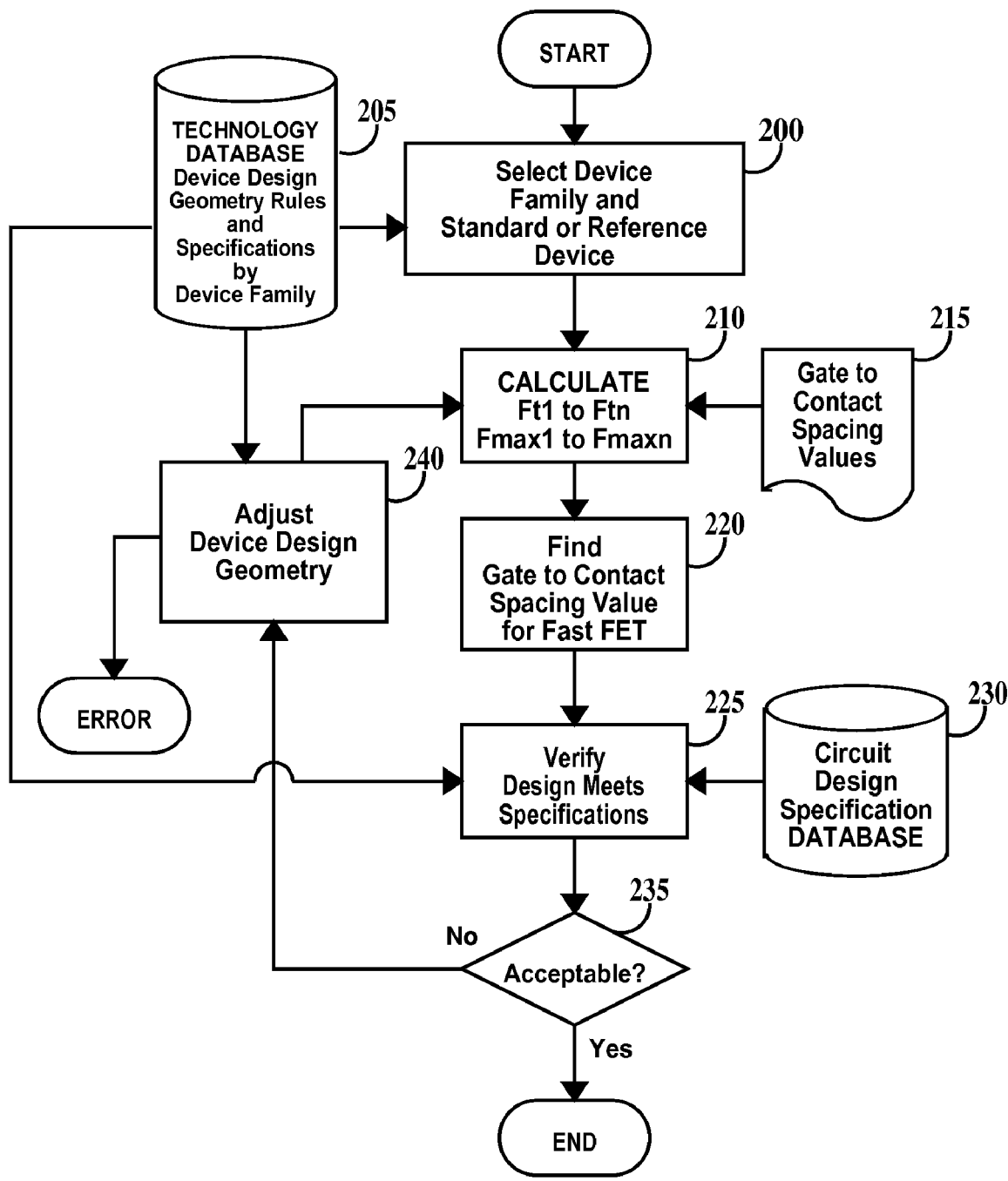
FIG. 5 is a flowchart of method for optimizing the performance of an FET according to embodiments of the present invention.

FIG. 5 is a flowchart of method for optimizing the performance of an FET according to embodiments of the present invention. In step 200, a device family and a reference device is selected from a technology database 205. Technology database includes device design geometry rules and parametric operating ranges by device family. Device families include (1) NFET or PFET, (2) thick or thin gate dielectric FETs and (3) high or low threshold voltage FETs and combinations thereof to give a few examples. Device design geometry rules include, for example, minimum and maximum line widths and spacings, examples of which include minimum channel length, minimum gate electrode pitch, minimum source/drain contact pitch and minimum source/drain contact to gate electrode spacing. Device design specifications include, for example, power supply voltages (i.e. Vdd and Vss), Fmax, Ft, gm and power consumption. In step, 210 a family of $Fmax_1$ to $Fmax_n$ and $Ft_1$ to $Ft_n$ values are calculated based on a set of source/drain contact to gate electrode spacing values ($Ds1_1$ to $Ds1_n$ and $Dd1_1$ to $Dd1_n$) using the values of $Ds0$, $Dd0$, $gm0$, $\Delta gm$, $Rg0$ and $\Delta Rwire$ from the reference device and equations (1) through (5) in the case $Ds0=Dd0$ and $Ds1_1=Dd1_1=D1_1$ through $Ds1_n=Dd1_n=D1_n$ or variants of equations (1) through (5) thereof in the case $Ds1_1 \neq Dd1_1$ through $Ds1_n \neq Ds1_n$. A reference device may be an actual pre-designed device or a simulated device. The values of $Ds1_1$ to $Ds1_n$ and $Dd1_1$ to $Dd1_n$ and $Fmax_1$ to $Fmax_n$ and $Ft_1$ to $Ft_n$ may be stored in a lookup table or content addressable register.

The following steps assume a symmetrical FET where $Ds0=Dd0$ and $Ds1_1=Dd1_1=D1_1$ through $Ds1_n=Dd1_n=D1_n$. In the case where the FET is not symmetrical and $Ds1_1 \neq Dd1_1$ through $Ds1_n \neq Ds1_n$ then $Ds1_{cur}$ and $Dd1_{cur}$ should be substituted for the term $D1_{cur}$.

Figure 9:
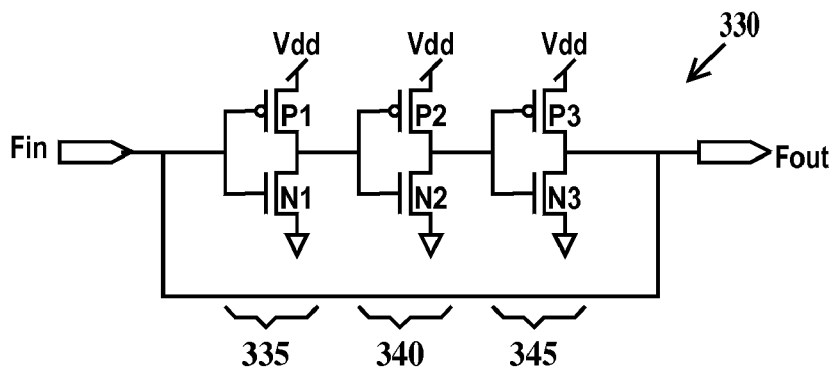
FIG. 9 is a circuit diagram of an exemplary ring oscillator.

In step 220, the source/drain contact to gate electrode spacing that results in a fast FET having a desired performance is selected. In step 225, the fast FET is verified to see if it meets device design specifications and circuit design specifications (from a circuit design specification database 230). The circuit selected may be a ring oscillator circuit as illustrated in FIG. 9 and described infra, or another circuit sensitive to FET performance. Verification is performed using simulation programs acting on a simulated circuit containing fast FETs. Additionally, in step 235, simulation programs acting on simulated circuits containing reference FETs may be performed and the maximum oscillation frequencies of the two simulated circuits compared. The simulated circuits selected may be ring oscillator circuits as illustrated in FIG. 9 and described infra, or other circuits that are sensitive to FET performance. If in step 235, the fast FET is verified (the simulation results are acceptable) or the circuit having the fast FET is significantly faster than the circuit having the reference FET, the design of the fast FET is complete, otherwise the method proceeds to step 240.

In step 240, the device design geometry of the reference FET is adjusted based on device design geometry rules or a new reference FET with a different design geometry is selected and the method returns to step 210. Examples of device design geometry adjustments include a change in FET channel width and FET channel length. Examples of different device design reference FET geometries include different FET channel widths, FET channel lengths and different numbers of gate electrode fingers. Provision is allowed for an exit from the method (error) if possible geometry adjustments are exhausted or a predetermined number of attempts at adjustments has been reached.

Figure 6:
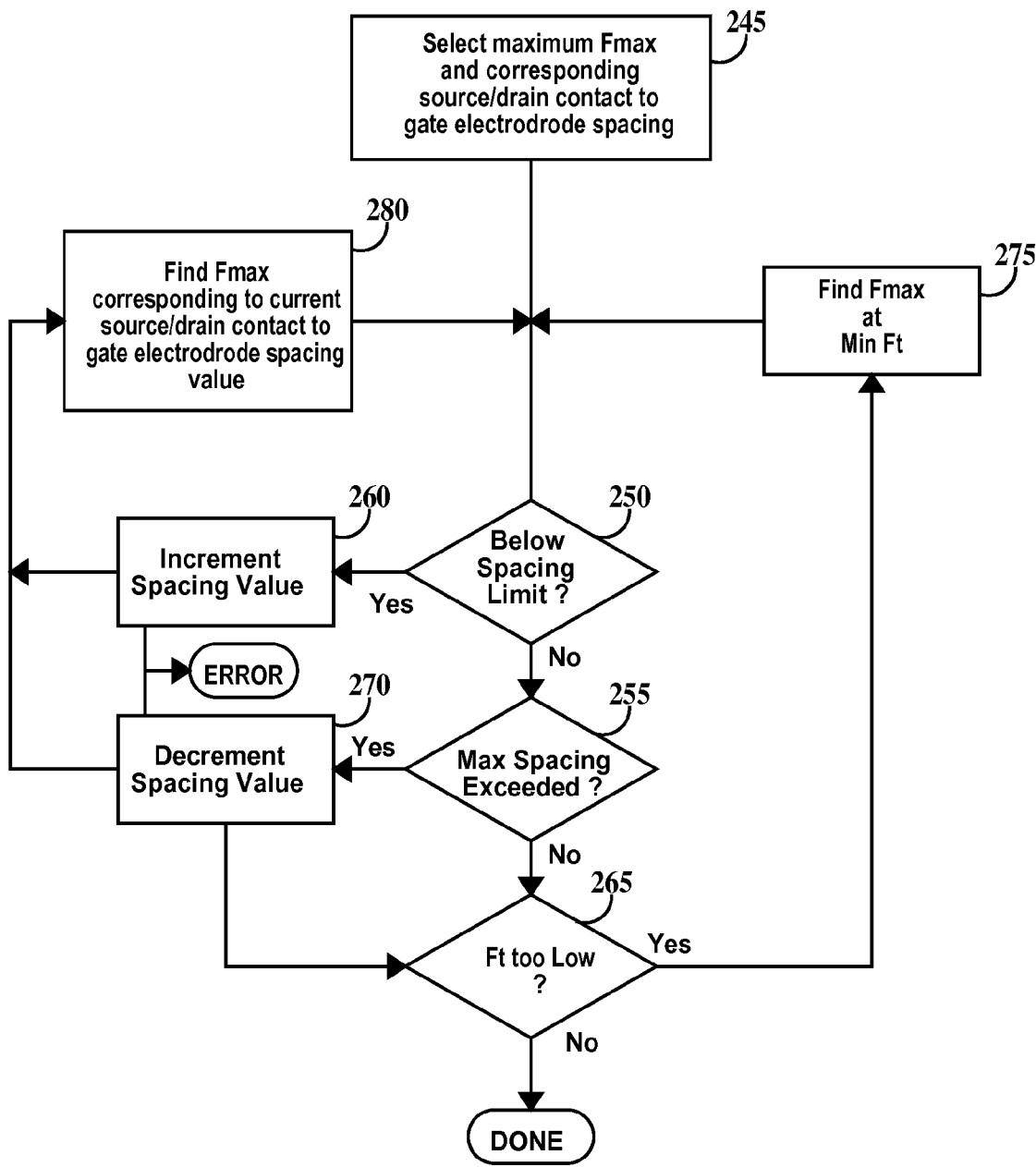
FIG. 6 is a flowchart of the method step 220 of FIG. 5.

FIG. 6 is a flowchart of the method step 220 of FIG. 5. In step 245, the maximum Fmax ($Fmax_{max}$) is selected from the calculated $Fmax_1$ to $Fmax_n$ values and the corresponding source/drain contact to gate electrode spacing $D1_{max}$ determined. $Fmax_{cur}$ is assigned the value of $Fmax_{max}$ and $D1_{cur}$ is assigned the value of $D1_{max}$. In step 250, it is determined if the value of $D1_{cur}$ is below a minimum source/drain contact to gate electrode spacing allowed. Step 250 allows increasing source/drain contact to gate electrode spacing for other reasons besides speed, for example, current crowding. If $D1_{cur}$ is not below the minimum source/drain contact to gate electrode spacing value then the method proceeds to step 255, otherwise the method proceeds to step 260.

In step 255 it is determined if the value of $D1_{cur}$ is above a maximum source/drain contact to gate electrode spacing allowed. Step 255 allows decreasing source/drain contact to gate electrode spacing in order not to increase the area of the fast FET beyond a predetermined area. If $D1_{cur}$ is not above the maximum source/drain contact to gate electrode spacing value then the method proceeds to step 265, otherwise the method proceeds to step 270.

In step 265 it is determined if the value of Ft corresponding to $D1_{cur}$ is below a minimum value for Ft allowed. Step 265 is optional. If Ft is not below the minimum value for Ft the selection of a value for $D1_{cur}$ is complete, otherwise the method proceeds to step 275. One can choose to simply maximize Fmax and ignore the corresponding value of Ft.

Returning to steps 260 and 270, in step 260 the value of $D1_{cur}$ is incremented and the method proceeds to step 280 or in step 270 value of $D1_{cur}$ is decremented and the method proceeds to step 280. The amount of incrementing or decrementing is fixed to track with the granularity of the $D1_1$ to $D1_n$. Steps 260 and 270 also track the previous values of D1cur and determine if values have already been used, in which case an error is generated indicating the method cannot proceed.

In step 280 the value of Fmax corresponding to $D1_{cur}$ is determined, $Fmax_{cur}$ is assigned this value and the method returns to step 250.

Returning to step 275, in step 275 the value of Fmax corresponding to a minimum value of Ft is determined and $Fmax_{cur}$ is assigned this value of Fmax, and $D1_{cur}$ is assigned the value of $D1_1$ through $D1_n$ corresponding the $Fmax_{cur}$ and the method returns to step 250.

Alternatively, the method can be restructured to maximize Ft and keep Fmax within pre-determined limits.

Figure 7:
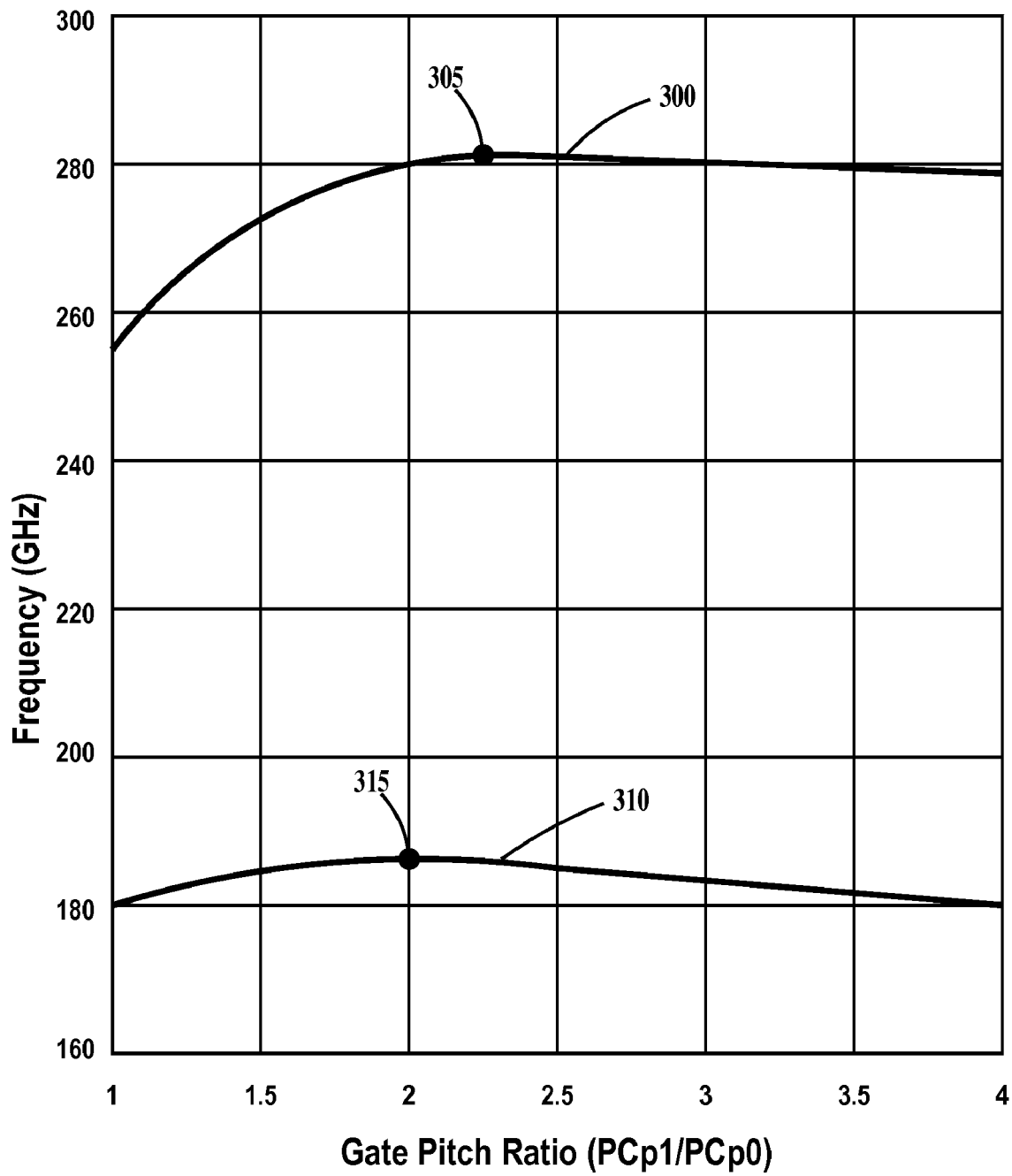
FIG. 7 is an exemplary plot of the current cut-off frequency and the power cut-off frequency versus gate pitch ratios of simulated FETs with increased gate pitch divided according to embodiments of the present invention by a simulated reference FET having a reference gate pitch.

FIG. 7 is an exemplary plot of the current cut-off frequency and the power cut-off frequency versus gate pitch ratios of simulated FETs with increased gate pitch divided according to embodiments of the present invention by a simulated reference FET having a reference gate pitch. Other than the gate-electrode pitch varying all other FET design parameters are held constant. In FIG. 7, Ft is indicated by curve 300, the maximum value of Ft is indicated by point 305, Fmax is indicated by curve 310, and the maximum value of Fmax is indicated by point 315. The horizontal axis is gate electrode pitch ratio (fast FET/reference FET). As discussed supra, the source/drain contact to gate electrode spacing is related to gate electrode pitch. In some cases, the FET design rules are framed in terms of source/drain contact pitch and gate electrode pitch with the source/drain contacts being equidistant between adjacent gates over the same well (a symmetrical FET) and this is a more useful number to report out of the algorithm than the actual source/drain contact to gate electrode spacing. In FIG. 7, it can be seen that the maximum value of Fmax occurs at a gate pitch ratio of about 2 and the maximum value of Ft occurs at a gate pitch ratio of about 2.25. Thus the larger (the greater the gate electrode pitch the larger the device) device (the fast FET, pitch=about 2) is faster than the smaller device (reference device pitch=1), which is contrary to conventional design methodology, where the fast FET would be designed to be smaller than the reference FET.

Figure 8:
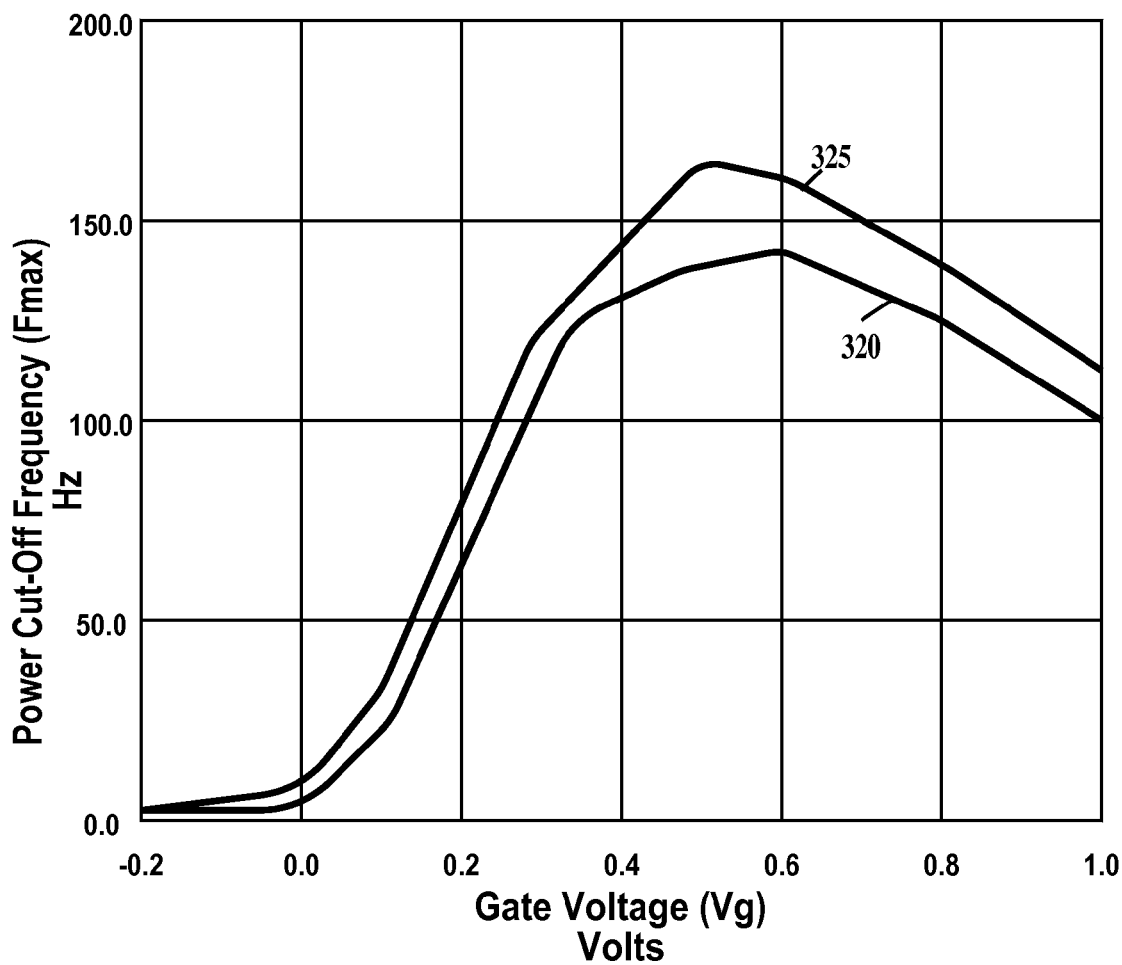
FIG. 8 is a plot of average Fmax versus gate voltage for actual FETs having different designed gate pitches.

FIG. 8 is a plot of average Fmax versus gate voltage for actual FETs having different designed gate pitches. In FIG. 8, curve 320 represents Vg versus Ft for a gate electrode pitch of about 0.25 microns, while curve 325 represents Vg versus Ft for a gate electrode pitch of about 0.5 microns. Again, the larger FET is faster, holding all other parameters other than pitch constant.

FIG. 9 is a circuit diagram of an exemplary ring oscillator. In FIG. 9, a ring oscillator 330 includes three inverter stages 335, 340 and 345 comprising respectively NFET N1 and PFET P1, NFET N2 and PFET P2, and NFET N3 and PFET P3. The input of ring oscillator 330 is connected to the input of first stage 335. The output of first stage 335 is connected to the input of second stage 340. The output of second stage 340 is connected to the input of third stage 345. The output of third stage 345 is connected to the output of the ring oscillator and to the input of the first stage. Ring oscillator 330 is exemplary of ring oscillators in general in that there must be an odd number of inverter stages.

Figure 10:
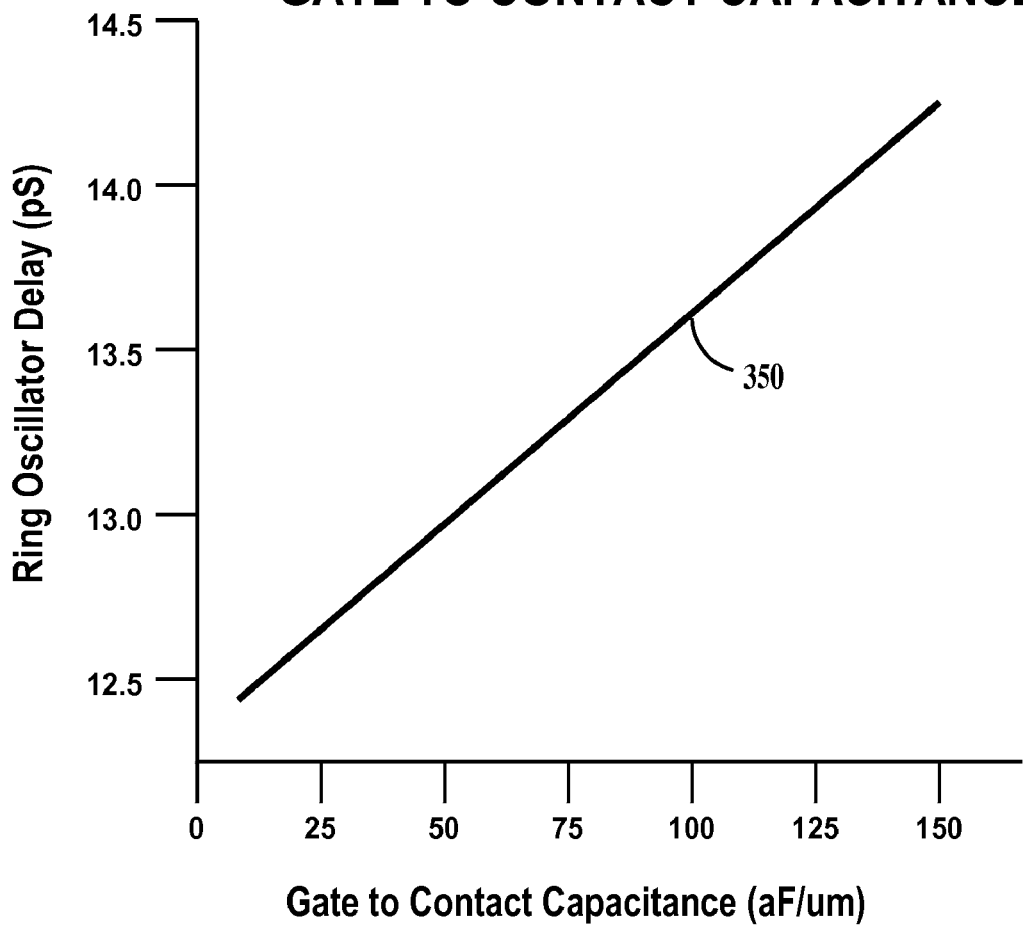
FIG. 10 is a simulation plot of ring oscillator delay versus gate to source/drain contact capacitance.

FIG. 10 is a simulation plot of ring oscillator delay versus gate to source/drain contact capacitance. Curve 350 represents a plot of gate to contact capacitance (Cc of FIG. 2 or C0D0/D (see equation (4)). FIG. 10 shows that by decreasing the source/drain contact to gate electrode capacitance the delay through the oscillator decreases and the speed of the oscillator increases. Since the embodiments of the present invention teach increasing the source/drain contact to gate electrode spacing of an FET increase the switching speed of an FET relative to a reference FET, it follows that circuits utilizing an FET having a greater source/drain contact to gate electrode spacing would be faster than a circuit having an FET having a reference a source/drain contact to gate electrode spacing.

Figure 11:
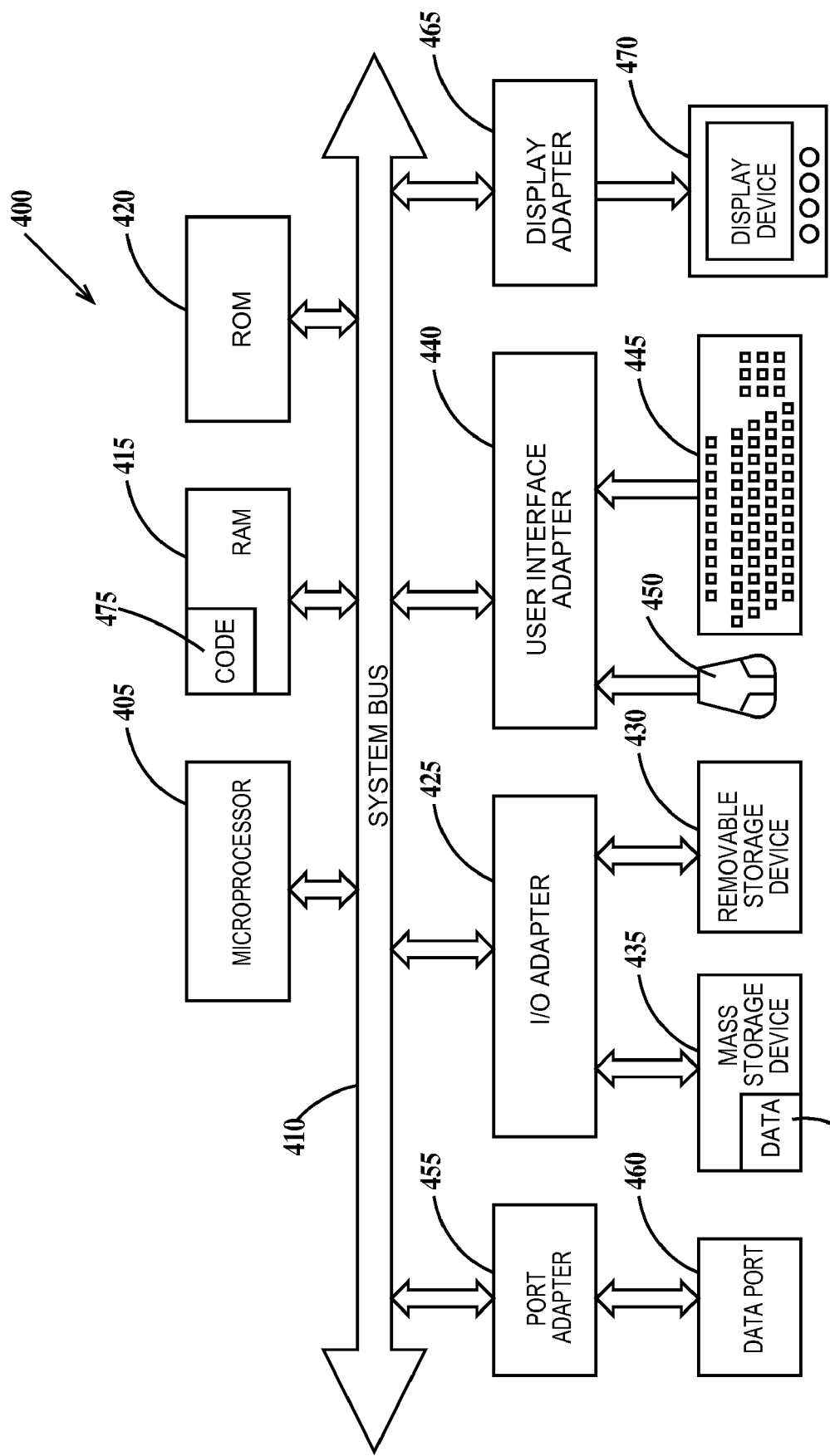
FIG. 11 is a schematic block diagram of a general-purpose computer for practicing the embodiments of the present invention.

FIG. 11 is a schematic block diagram of a general-purpose computer for practicing the embodiments of the present invention. In FIG. 11, computer system 400 has at least one microprocessor or central processing unit (CPU) 405. CPU 405 is interconnected via a system bus 410 to a dynamic random access memory (DRAM) device 415 and a read-only memory (ROM) device 420, an input/output (I/O) adapter 425 for connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

Either of devices 415 and 420 contains the basic operating system for computer system 400. Removable data and/or program storage device 430 may be a magnetic media such as a floppy drive, a tape drive or a removable hard disk drive or optical media such as CD ROM or a digital video disc (DVD) or solid state memory such as ROM or DRAM or flash memory. Mass data and/or program storage device 435 may be a hard disk drive or an optical drive. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

One of devices 415, 420, 430 or 435 includes a computer code 475 (illustrated by way of example in device 415), which is a computer program that comprises computer-executable instructions. Computer code 475 includes an algorithm optimizing the performance of an FET (e.g. the algorithm of FIGS. 5 and 6). CPU 405 executes computer code 475. Any of devices 415, 420, 430 or 435 may include input data 480 (illustrated by way of example in device 435) required by computer code 475. Display device 470 displays output from computer code 475.

Any or all of devices 415, 420, 430 and 435 (or one or more additional memory devices not shown in FIG. 11) may be used as a computer usable medium (or a computer readable medium or a program storage device) having a computer readable program embodied therein and/or having other data stored therein, wherein the computer readable program comprises computer code 475. Generally, a computer program product (or, alternatively, an article of manufacture) of the computer system 400 may comprise the computer usable medium (or the program storage device).

Figure 12:
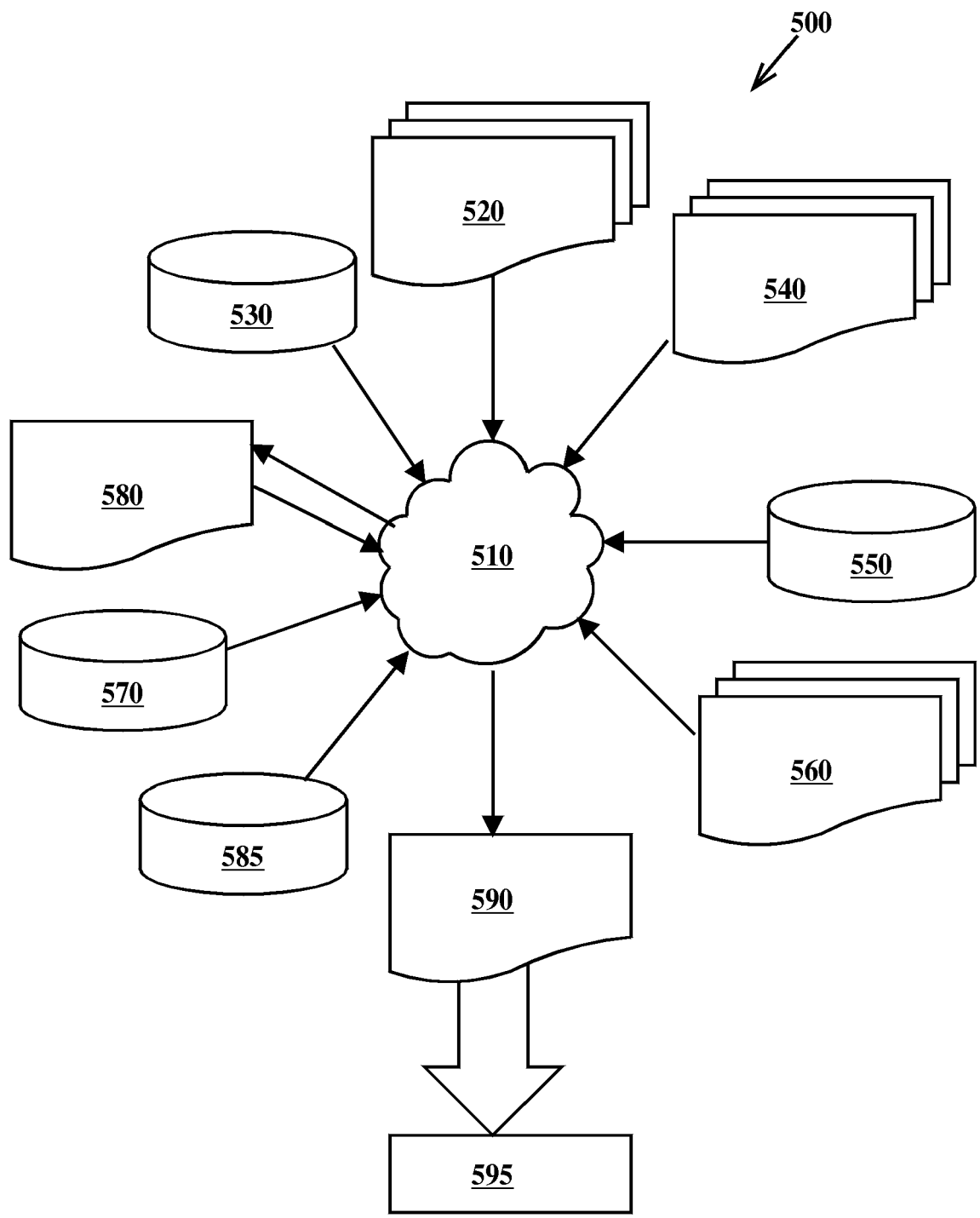
FIG. 12 is a flow diagram of a design of a process used in semiconductor design, manufacturing, and/or test.

FIG. 12 is a flow diagram of a design of a process used in semiconductor design, manufacturing, and/or test. In FIG. 12, a design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 comprises device 100 or device 100A or device 165 in the form of schematics or HDL, a hardware-description language (e.g., Verilog, VHDL, C, etc.). Design structure 520 may be contained on one or more machine readable medium. For example, design structure 520 may be a text file or a graphical representation of device 100 or device 100A or device 165. Design process 510 preferably synthesizes (or translates) device 100 or device 100A or device 165 into a netlist 580, where netlist 580 is, for example, a list of wires, transistors, logic gates, control circuits, I/O, models, etc. that describes the connections to other elements and circuits in an integrated circuit design and recorded on at least one of machine readable medium. This may be an iterative process in which netlist 580 is re-synthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 50 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Ultimately, design process 510 preferably translates device 100 or device 100A or device 165, along with the rest of the integrated circuit design (if applicable), into a final design structure 550 (e.g., information stored in a GDS storage medium). Final design structure 550 may comprise information such as, for example, test data files, design content files, manufacturing data, layout parameters, wires, levels of metal, vias, shapes, test data, data for routing through the manufacturing line, and any other data required by a semiconductor manufacturer to produce device 100 or device 100A or device 165. Final design structure 550 may then proceed to a stage 555 where, for example, final design structure 550: proceeds to tape-out, is released to manufacturing, is sent to another design house or is sent back to the customer.

Thus the present invention discloses a process for supporting computer infrastructure, integrating, hosting, maintaining, and deploying computer-readable code into the computer system 400, wherein the code in combination with the computer system 400 is capable of performing a method for optimizing the performance of an FET.

Thus the embodiments of the present invention provide a methodology to overcome the scalability issues of CMOS technology. Specific applications of the present invention include, but are not limited to radio frequency and millimeter-wave, digital circuits and analog circuits using CMOS devices.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure comprising design data embodied on a computer readable storage medium, said design data being useable for designing, manufacturing, and/or testing an integrated circuit, said design data describing that a fast field effect transistor comprises: a source, a drain, a channel between said source and drain, a gate electrode over said channel, one or more source contacts to said source and one or more drain contacts to said drain, each of said one or more source contacts spaced a first distance from said gate electrode and each of said one or more drain contacts spaced a second distance from said gate electrode; and wherein said first and second distances, and a power cut-off frequency of said fast field effect transistor are greater than respective first and second distances and a power cut-off frequency of an otherwise identical reference field effect transistor; wherein said design data comprises a netlist, which describes the fast field effect transistor.

* * * * *